United States Patent [19]
Haroun et al.

[11] Patent Number: 6,151,262
[45] Date of Patent: Nov. 21, 2000

[54] APPARATUS, SYSTEM AND METHOD FOR CONTROL OF SPEED OF OPERATION AND POWER CONSUMPTION OF A MEMORY

[75] Inventors: Baher S. Haroun, Allen; Uming Ko, Plano, both of Tex.

[73] Assignee: Texas Instruments Incorporated, Dallas, Tex.

[21] Appl. No.: 09/426,960

[22] Filed: Oct. 26, 1999

Related U.S. Application Data

[60] Provisional application No. 60/105,925, Oct. 28, 1998.

[51] Int. Cl.⁷ ............................................. G11C 7/00
[52] U.S. Cl. ....................... 365/227; 365/229; 713/300
[58] Field of Search ............................... 365/227, 229, 365/226; 713/300, 250.05

[56] References Cited

U.S. PATENT DOCUMENTS

| | | | |
|---|---|---|---|
| 5,686,767 | 11/1997 | Helfrich et al. | 365/229 |
| 5,696,729 | 12/1997 | Kitamura | 365/227 |
| 5,860,016 | 1/1999 | Nookala et al. | 713/300 |
| 5,870,613 | 2/1999 | White et al. | 365/229 |
| 5,889,723 | 3/1999 | Pascucci | 365/229 |

*Primary Examiner*—Tan T. Nguyen
*Attorney, Agent, or Firm*—Robert D. Marshall, Jr.; W. James Brady, III; Frederick J. Telecky, Jr.

[57] ABSTRACT

This invention concerns power consumption control of memory having a fully powered state and at least one lower power state. The invention changes the memory to the fully powered state upon receipt of a memory access request. This memory access request is serviced in the fully powered state. The memory is returned to a lower power state after expiration of a grace period following a last memory access request. This grace period can be measured by a predetermined time or a predetermined number of memory access requests or a combination of these factors. The predetermined time may be fixed in manufacture or programmable in operation via a control register or data stored in a predetermined set of address locations within the address space of the memory. This invention is useful in portable electronic devices such as wireless telephones.

28 Claims, 3 Drawing Sheets

APPARATUS, SYSTEM AND METHOD FOR CONTROL OF SPEED OF OPERATION AND POWER CONSUMPTION OF A MEMORY

This application claims priority under 35 USC §119(e)(1) of Provisional Application Ser. No. 60/105,925, filed Oct. 28, 1998.

TECHNICAL FIELD OF THE INVENTION

The technical field of this invention is control of the speed of operation and power consumption of a memory device, especially a FLASH memory embedded in a digital signal processor controller for a wireless telephone.

BACKGROUND OF THE INVENTION

The continuing popularity of portable electronic devices presents manufacturers with contrary goals. Battery capacity is dependent upon battery size and weight. Thus portable electronic devices could be made to operate a longer time between battery changes or recharging if these devices included heavier batteries with greater capacity. On the other hand, portable electronic devices would be more popular and more widely used if they were lighter. However, lighter weight translates into reduced battery capacity and reduced operating times. A large reduction in size of wireless telephones has taken place without significant reduction in operating times. While improvements in batteries have increased their capacity per unit weight, most of the improvement in operating time and reduction in device weight have come from improvements in the power consumption of the electronics. Many improvements have taken place in integrated circuit manufacture that have reduced the amount of power consumed by the electronics. Additional improvements have taken place by selective powering of portions of the electronics. To a large degree much of the advantage of selectively powering a microcontroller unit or a digital signal processor have already been realized by current state of the art devices. Thus manufacturers seek additional areas for power consumption reduction.

This additional area may be the system memory. Many portable electronic devices include substantial amounts of memory. There is relatively little potential power savings to be gained by selectively powering volatile memory, such as dynamic random access memory (DRAM). By definition volatile memory loses the data stored within upon removal of electric power. Such loss of data would generally be catastrophic to operation of the device. On the other hand, many portable electronic systems include substantial amounts of nonvolatile memory. Such nonvolatile memory is typically employed to store the program code controlling operation of the device. Some portable electronic devices, such as wireless telephones, now employ FLASH memory for program code. Such FLASH memory has the advantage that it may be reprogrammed in the field. This capability of FLASH memory could permit user upgrades and enhancements after the initial sale. Thus there may be an advantage to selectively powering FLASH memory in portable electronic devices.

Selective powering of FLASH memory is known in the art. The technique of the prior art employs a FLASH memory having a fully powered active state and a low power inactive or standby state. In the technique of the prior art, the FLASH memory is normally kept in a low power standby state. Upon detection of a request for a memory access the FLASH memory is fully powered to permit the memory access. Following response to the memory access, the FLASH memory is returned to the low power standby state. The process of fully powering the FLASH memory requires much more time than that required for a memory access in the fully powered state. Thus the access time includes both the time required to power up the FLASH memory and the normal access time. Therefore system operation may be slowed due to the slow memory access. The access time may be substantially reduced by keeping the FLASH memory in the fully powered active state. This would result in greater power consumption. Thus the prior art fully powers the memory upon each access and then immediately returns to the low power standby state.

SUMMARY OF THE INVENTION

This invention concerns power consumption control of memory having a fully powered state and at least one lower power state. The invention changes the memory to the fully powered state upon receipt of a memory access request. This memory access request is serviced in the fully powered state. The memory is returned to a lower power state after expiration of a grace period following a last memory access request. This grace period can be measured by a predetermined time or a predetermined number of memory access requests or a combination of these factors. The predetermined time may be fixed in manufacture or programmable in operation via a control register or data stored in a predetermined set of address locations within the address space of the memory. This invention is useful in portable electronic devices such as wireless telephones.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
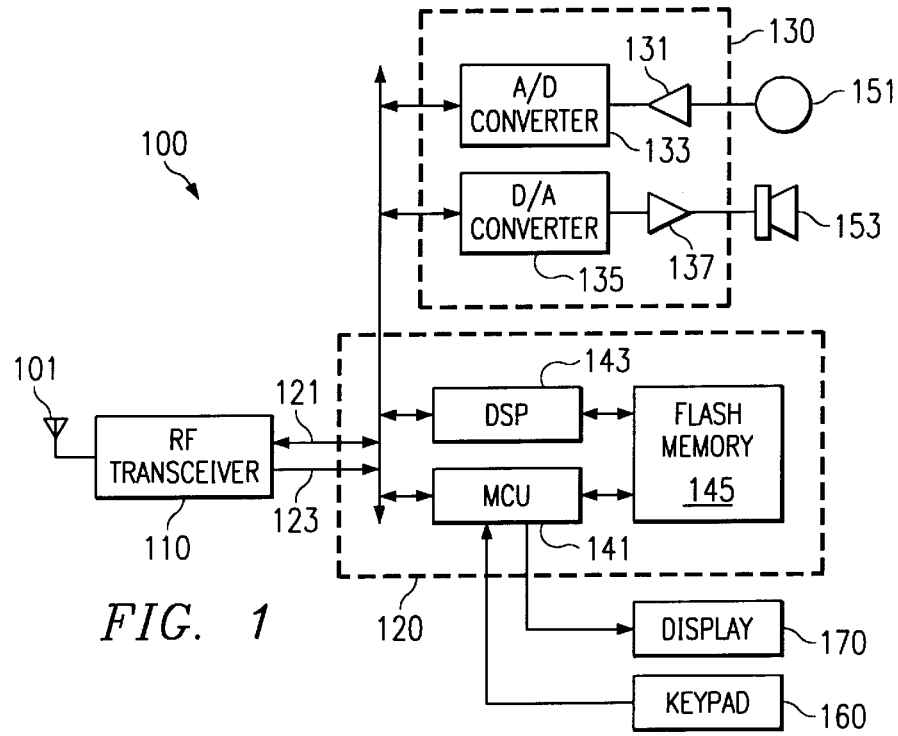
FIG. 1 illustrates in a block form a wireless telephone as an example of a portable electronic device in which this invention may be advantageously employed.

Memory accesses typically occur in bursts for portable electronic devices having processors performing real time tasks. Thus a access received when the nonvolatile memory is in a lower power state is usually followed by a number of consecutive accesses. This number of accesses may be deterministic, such as the memory accesses to fill a processor cache line. The number of such accesses may be indeterminate but have strong statistical tendencies dependent upon the particular application. Thus it is often possible to determine in advance the mean and distribution of the number of consecutive or closely spaced memory accesses for any particular portable electronic device.

The prior art FLASH memory power on demand is not optimal for devices which typically have bursts of memory accesses. A significant time is required each time the memory is restored to the full power active state to service the memory access. Immediate return to a lower power standby state requires that this power up time be expended for each memory access. Retaining the nonvolatile memory in the fully powered active state eliminates this time penalty for each memory access. This is because the memory responds to access requests fastest when in the fully powered active state. Thus it would be advantageous from a speed of operation view to keep the memory in the fully powered active state. However, this would result in increased electric power consumption.

This invention proposes an improved power management technique for portable electronic devices which typically exhibit such bursts of memory accesses. The invention proposes deferring return to a lower power standby state by a grace period. During this grace period, the nonvolatile memory is kept in the fully powered active state. Because the nonvolatile memory is in the fully powered active state, the memory responds to subsequent memory access within a burst faster than if the memory were immediately returned to the lower power standby state. This may result in a lower total energy expenditure within the memory than in the prior art. For consecutive memory accesses the memory needs to power up from standby state only once per burst and not once per memory access as in the prior art. Thus the total electric energy consumed for a burst of memory accesses may be lower than in the prior art. This reduced power consumption is achieved while the average time for memory access is reduced. In addition the greater speed of access may result in power savings for other parts of the portable electronic device. In the typical device which responds to real time inputs, other parts of the device would be fully powered pending the memory access. Thus keeping the memory at the fully powered active state for subsequent memory accesses of a burst could reduce the total time other system components are fully powered. Thus total system power consumption may be reduced even if powering the memory during the grace period sometimes results in greater memory power consumption.

There are two main methods for measuring the grace period during which the memory is retained at the fully powered active state. The first method is by time. The memory could be returned to the lower power standby state a predetermined time following the last memory access. This time could be set to about the average length of time between memory access of the typical burst of accesses. This interval of time could be measured by counting clock pulses of a system clock having a known frequency. Upon each receipt of a new memory access request, this counter would be reset to the initial count. This restarts the grace period. Upon expiration of the grace period measured by the counter counting a predetermined number of clock pulses, the memory would be returned to a lower power standby state.

The second method of measuring the grace period is by the number of memory accesses. As noted above, the number of memory accesses within a typical burst may be deterministic, such as the number of memory accesses needed to fill a cache line within a data processor. Thus a counter would count the number of memory accesses and then return the memory to the lower power standby state upon reaching a predetermined number of accesses.

It may also be advantageous to measure the grace period in terms of a compound function of time and number of memory accesses. In the cache line fill example, suppose an access burst had a shorter length than the number of accesses needed to fill a cache line. In that case the memory would not return the lower power standby state until the next burst of memory accesses. A way to deal with cases where mixed number bursts are common involves a compound decision based upon both time and number of accesses. During the time when less than the predetermined number of accesses has been received, the expiration of a first predetermined time since the last access results in return to the lower power standby state. Following receipt of the predetermined number of accesses, expiration of a second, shorter period of time since the last access returns the memory to the lower power standby state. This second period of time could be immediate, i.e. zero time. Such compound decisions would enable near optimal powering of the memory in response to memory access bursts of differing length.

Many portable electronic devices to which this invention is applicable perform a limited set of functions. Thus the memory access behavior can be studied and quantified. In such a case, a fixed set of states with corresponding fixed criteria for state transition could be implemented. The state diagram implemented and the particular times or count for state transitions could be fixed in manufacture of the portable electronic device. This fixed function could be achieved by a fixed state machine or by loading an adaptable state machine with fixed control parameters upon initial application of electric power. These alternatives will be further discussed below.

The greatest flexibility in the invention is afforded by permitting programming of the time interval or number of bursts used to measure the grace period. These numbers could be written into a writable control register within the register space of an attached data processor. This data processor could be a microcontroller unit or a digital signal processor. Alternatively, a predetermined memory location or set of memory locations within the address space of the memory could be employed. Thus writing the appropriate data into the register or predetermined memory location would permit the original equipment manufacturer to tailor the powering of the memory to the particular product made. This adaptability could even be used to tailor the powering of the memory to the particular process currently executing on the portable electronic device. A new set of such power control parameters could thus be loaded upon each task switch. As an alternative, the power control parameters could be adaptable to the history of time and number of memory accesses. Such run time adjustments could be implemented in the fashion the some superscalar microprocessors provide run time adaptable branch prediction based on the branch history.

The operation of the present invention will now be described in detail with respect to the design example of a wireless telephone. Those skilled in the art would realize that the techniques of this invention are equally applicable to many other portable electronic devices which include a data processor and selectively powered memory.

FIG. 1 illustrates in block diagram form a wireless telephone as an example of a portable electronic device which could advantageously employ this invention. Wireless telephone 100 includes antenna 101, radio frequency transceiver 110, baseband circuits 120, microphone 151, speaker 153, keypad 160, display 170 and battery 180. Antenna 101 permits wireless telephone 100 to interact with the radio frequency environment for wireless telephony in a manner known in the art. Radio frequency transceiver 110 both transmits and receives radio frequency signals via antenna 101. The transmitted signals are modulated by the voice/data output signals 121 received from baseband circuits 120. The received signals are demodulated and supplied to baseband circuits 120 as voice/data input signals 123. Baseband circuits 120 includes an analog section 125 and a digital section 127. Analog section 130 includes an amplifier 131 connected to microphone 151 and a corresponding analog to digital converter 133 as known in the art. Microphone 151 receives the voice input from the user of the phone. Analog section 130 also includes a digital to analog converter 135 and amplifier 137 connected to speaker 153 as known in the art. Speaker 153 provides the voice output to the user. Digital section 140 is embodied in one or more integrated circuits and includes a microcontroller unit 141, a digital signal processor 143 and a FLASH memory 145. Microcontroller unit 141 interacts with keypad 160 to receive telephone number inputs and control inputs from the user. Microcontroller unit 141 supplies the drive function to display 170 to display numbers dialed, the current state of the telephone such as battery life remaining and received alphanumeric messages. Digital signal processor 143 provides real time signal processing for transmit encoding, receive decoding, error detection and correction, echo cancellation, voice band filtering, etc. Both microcontroller unit 141 and digital signal processor 143 interface with FLASH memory 145 for recall of instructions. FLASH memory 145 is best used for write-once-read-many operations such as storage of program instructions. This is because writing to FLASH memory 145 requires more electric power and more time than reading from FLASH memory 145. FLASH memory 145 is nonvolatile, that is, it retains the stored data upon removal of electric power. As such, FLASH memory 145 is ideal for storage of instructions for microcontroller unit 141 and digital signal processor 143. However, FLASH memory 145 may also advantageously store relatively unchanging data such as frequently used filter coefficients and the like. The entire wireless telephone 100 is powered by battery 180. There would typically be some form of electric power consumption management. This could be in the form of a central power management function or distributed power management over the various circuits. This invention is primarily concerned with selective powering of FLASH memory 145.

Figure 2:
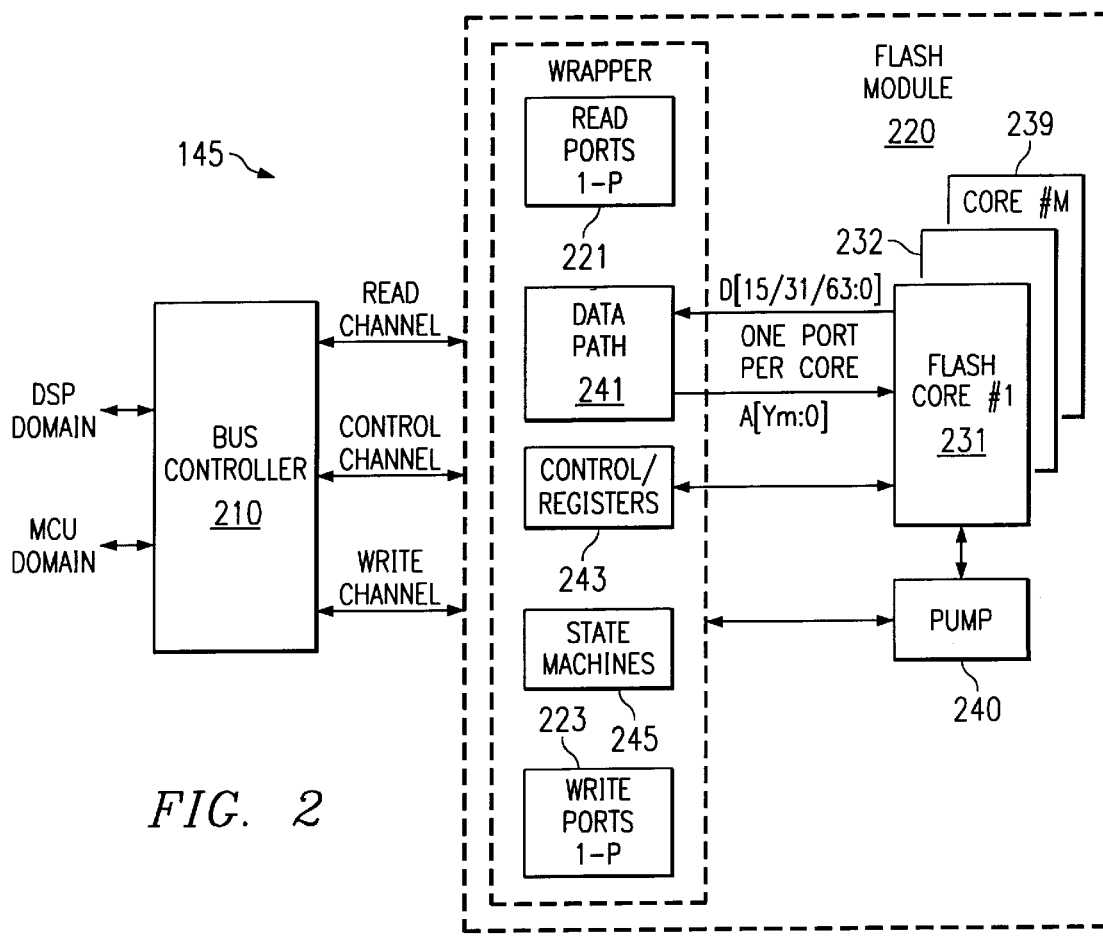
FIG. 2 illustrates in a block form the FLASH memory of the wireless telephone illustrated in FIG. 1.

FIG. 2 illustrates the internal circuits of FLASH memory 145 in the preferred embodiment of this invention. FLASH memory 145 is bidirectionally coupled to both microcontroller unit 141 (MCU) and digital signal processor 143 (DSP) via bus controller 210. Bus controller 210 is bidirectionally coupled to FLASH module 220 via three channels. The read channel connects to read ports 221 and permits control of data from FLASH cores 231 to 239 and either microcontroller unit 141 (MCU) and digital signal processor 143 (DSP) via data path 241 and bus controller 210. The control channel permits either microcontroller unit 141 (MCU) and digital signal processor 143 (DSP) to control the operation of FLASH module 220 via bus controller 210. In particular, this control channel enables setting of the state of control registers 243. State machine 245 is responsive to the settings of control registers 243 for selection of control parameters for FLASH memory 145, including control of electric power consumption, in a manner that will be further detailed below. This control includes controlling the supply of electric power to FLASH cores 231 to 239 and charge pump 240. The write channel enables data originated by microcontroller unit 141 or digital signal processor 143 to be supplied via bus controller 210 and write ports 223 to FLASH cores 231 to 239 to be stored. The essential feature of FLASH memory 145 for the purposes of this invention is that the transitions between various power states is controlled by state machines 245 according to parameters stored in control registers 243.

FLASH memory 145 illustrated in FIGS. 1 and 2 supports four power states. These correspond to various powered states of the memory core and the charge pump employed to power the memory. Table 1 lists the powered status of the memory core and the charge pump, the memory access times and the electric power consumption of the four powered states: active; standby2; standby1 and sleep. The shorter access time listed in the active mode is for a page mode access in which the most significant bits of the address accessed are the same as the previous memory access. Note that FLASH memory 145 of this example draws power from both a 1.8 volt power supply and a 3.0 volt supply. Table 1 list the current drawn from these two power supplies for each power mode.

TABLE 1

| Power Mode | Memory Cores | Charge Pump | Access Time | Current Drawn 1.8 V/3.0 V |
|---|---|---|---|---|
| Active | active | active | 20 nS/30 nS | 10 mA/5 mA |
| Standby2 | standby | active | 60 nS | 2.5 mA/5 mA |
| Standby1 | sleep | standby | 100 nS | 10 µA/50 µA |
| Sleep | sleep | sleep | 600 nS | 10 µA/10 µA |

The various circuits for effecting each of these modes is known in the art and will not be further described here. For the purposes of this application is it sufficient to realize that FLASH memory 145 may be placed in various power modes with consequent effect on the memory access time and the electric power consumed.

Figure 3:
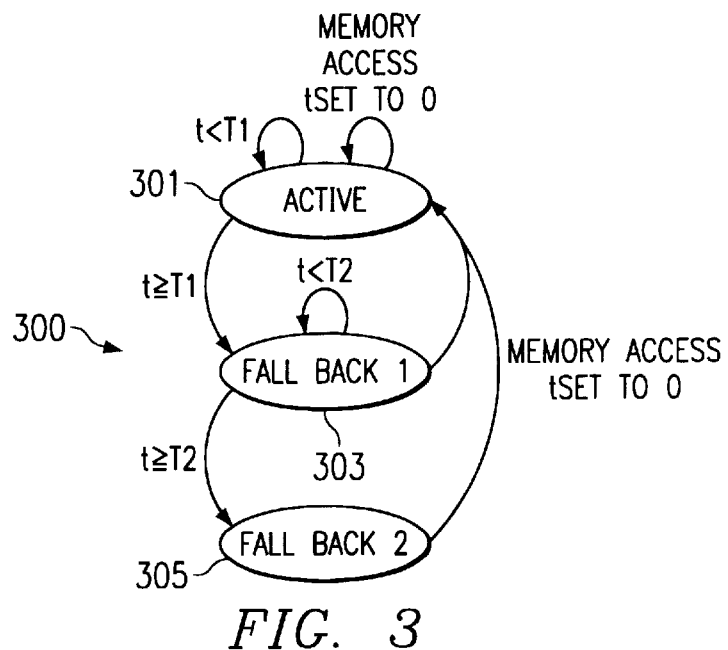
FIG. 3 illustrates a first exemplary state diagram according to this invention.

FIG. 3 illustrates an exemplary state diagram one embodiment of this invention. State diagram 300 includes three states, active state 301, fallback1 state 303 and fallback2 state 305. Regardless of whether the initial state is active state 301, fallback1 state 303 or fallback2 state 305, receipt of a memory access request changes to active state 301. At the same time the timer represented by the timer variable t is set to 0. The system remains in active state 301 while the timer variable t is less than a first constant time T1. When the timer variable t equals or exceeds the first constant time T1, the system transitions to fallback1 state 303. As will be further explained below, fallback1 state 303 could be any of the four valid states active, standby1, standby2 or sleep. Fallback1 state would generally be selected as a state when FLASH memory 145 consumes less electric power than in the active state 301. While in fallback1 state 303 receipt of a memory access request causes the system to transition back active state 301 and reset the timer variable t. If no new memory access requests are received, the system remains in fallback1 state 303 for an additional interval equal to second constant time T2. That is, during the interval t<T2 the system remains in fallback1 state 303. Following expiration of that interval when t≧T2, the system transitions to fallback2 state 305. As will be further explained below, fallback2 state 305 could be any of the four valid states active, standby2, standby2 or sleep, but would generally be selected as a lower power state than fallback1 state 302. Upon reaching fallback2 state 305, the system remains in this state until receipt of a memory access request. Upon such a memory access request, the system transitions to active state 301 and resets the timer variable t.

Figure 4:
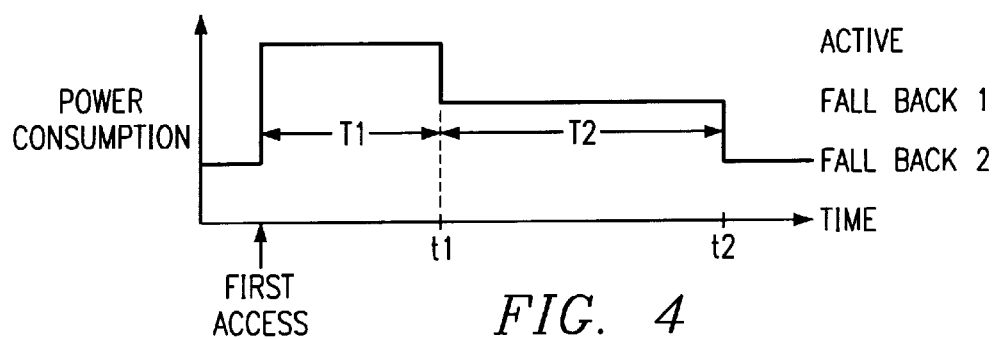
FIG. 4 illustrates a graph of power consumption versus time for a first example according to the exemplary state diagram illustrated in FIG. 3.

FIG. 4 illustrates a graph of power consumption versus time for a first example of transition through state diagram 300. In this example of FIG. 4, a single memory access is received. The system is initially in fallback2 state 305, which in this example is selected as the lowest power consumption state. Upon receipt of the single memory access request, the system enters active state 301. At time t1 following elapse of the first constant time T1, the system enters fallback1 state 303. FIG. 4 illustrates that fallback1 state 303 has been selected as a state having intermediate power consumption between the active state 301 and the state selected for fallback2 state 305. At time t2 following further elapse of the second constant time T2, the system enters fallback2 state 305 where it remains for the rest of this example.

Figure 5:
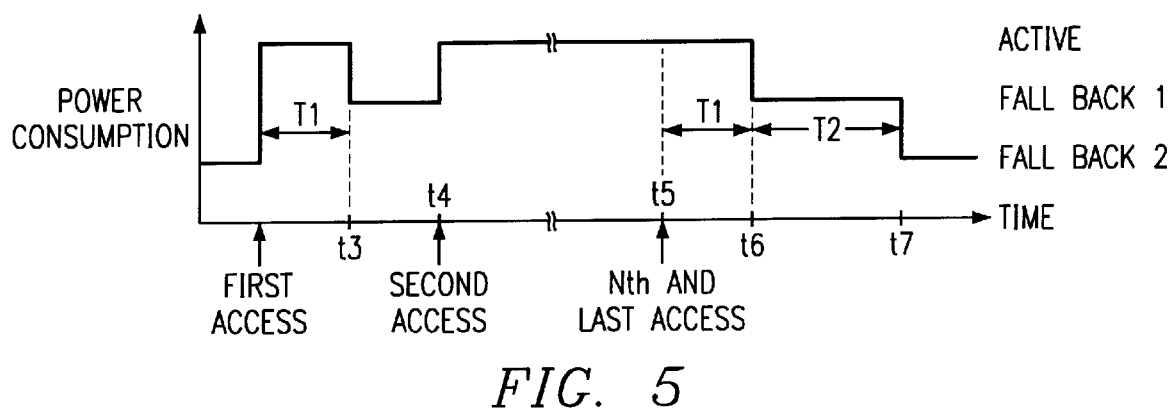
FIG. 5 illustrates a graph of power consumption versus time for a second example according to the exemplary state diagram illustrated in FIG. 3.

FIG. 5 illustrates a graph of power consumption versus time for a second example of transition through state diagram 300. In this second example of FIG. 5, a single memory access is received followed by a burst of memory accesses at intervals of less than the first constant time T1. The system is initially in fallback2 state 305, the lowest power consumption state. Upon receipt of the first memory access request, the system enters active state 301. At time t3 following elapse of the first constant time T1, the system enters fallback1 state 303 having intermediate power consumption. At time t4 the second access request is received. This second memory access request is received at a time less than the second constant time T2 following transition to fallback1 state 303. Therefore the system transitions to active state 301 in response to this memory access request without ever having reached fallback2 state 303. The system remains at active state 301 throughout the burst of memory accesses. With the interval between consecutive memory access requests less than T1, the variable timer t never reaches T1. Thus the system does not transition to fallback1 state 303 during this interval. At time t5 the Nth and last memory access request of the burst is received. At time t6 the first constant time T1 has elapsed since the Nth memory access. The system transitions to fallback1 state 303. At time t5 the second constant time T2 has elapsed since the Nth memory access. The system enters fallback2 state 305 where it remains for the rest of this example. Note that this example does not involve any run time adaptability of the control parameters.

Figure 6:
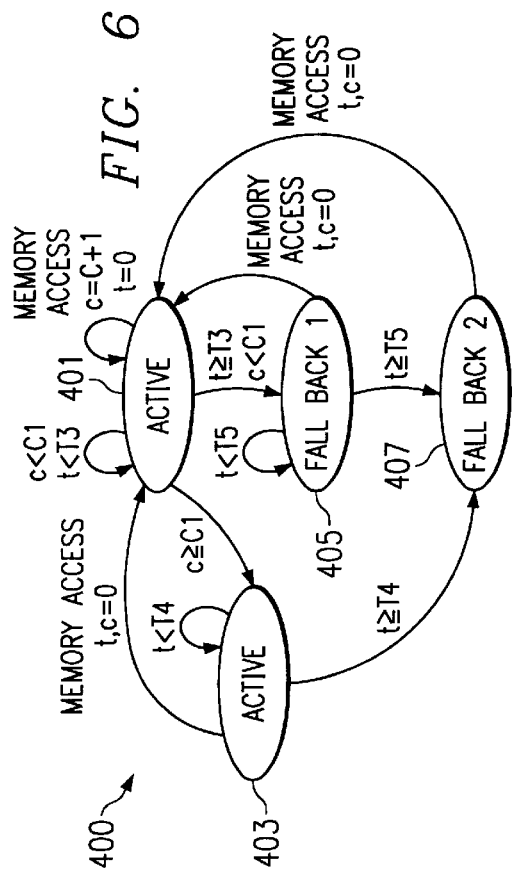
FIG. 6 illustrates a second exemplary state diagram according to this invention.

FIG. 6 illustrates a second example state diagram 400 which employs memory access counts for at least one state transition. State diagram 400 includes four states, active states 401 and 403, fallback1 state 405 and fallback2 state 407. If the initial state is active state 403, fallback1 state 405 or fallback2 state 407, receipt of a memory access request changes to active state 401. At the same time the timer represented by the timer variable t is set to 0 and the count of memory accesses is set to 0. The system remains in active state 401 while both the memory access count c is less than a constant C1 and the timer variable t is less than a first constant time T1. Receipt of another memory access when in active state 401 increments the memory access count c and resets the timer variable t. If this causes the memory access count to equal or exceed the constant C1, then the system transitions to active state 403. Variable timer t is reset. Receipt of another memory access request returns the system to active state 401. When the timer variable t equals or exceeds the constant time T4, the system transitions to fallback2 state 407. Alternatively, the system can transition out of active state 401 if the timer variable t exceeds a constant T3 even if the memory access count c is still less than the constant C1. In this case the system transitions to fallback1 state 405. While in fallback1 state 405 receipt of a memory access request causes the system to transition back active state 401 and reset the memory access count and the timer variable t. If no new memory access requests are received, the system remains in fallback1 state 405 for a constant time T5. Upon reaching fallback2 state 407, the system remains in this state until receipt of a memory access request. Upon such a memory access request, the system transitions to active state 401 and resets both the memory access count c and the timer variable t.

The state diagram 400 of FIG. 6 may be advantageously used where at least some memory access bursts are deterministic. This might occur, for example, for cache line fills. If memory access occur at short intervals, the system remains in active state 401 until the deterministic count is reached. The constant time T4 may be a short time or zero time. This constant should be just long enough to keep FLASH memory 145 in the active state to check for the occurrence of another deterministic burst of memory accesses following shortly after the initial burst. On the other hand, if the number of memory accesses is less than the deterministic number of the cache line fill, then there is no need to keep FLASH memory 145 fully active until the count is reached. Because this case corresponds to the nondeterministic number of memory accesses, an intermediate transition to fallback1 state 405 may advantageously conserve power.

Figure 7:
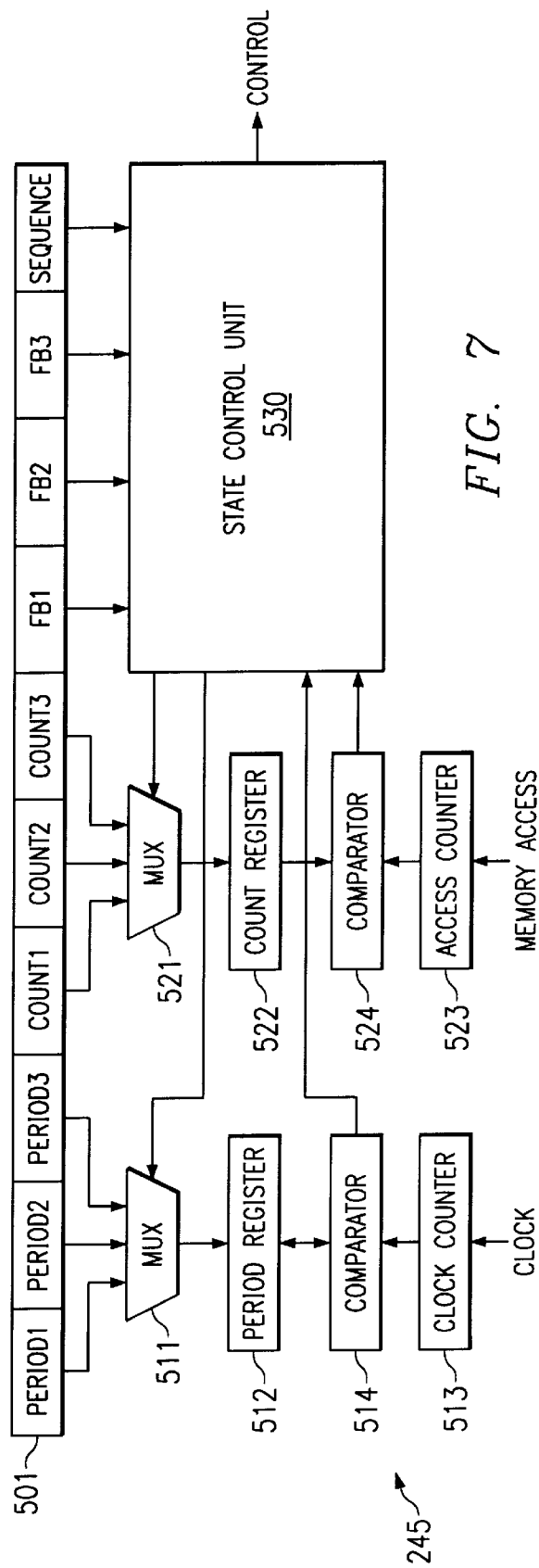
FIG. 7 illustrates an example circuit implementing the power consumption control of this invention.

FIG. 7 illustrates an example circuit for implementing the power consumption state control of this invention. Power control parameter register 501 stores parameters employed in the power consumption control. These parameters include a sequence field which indicates the particular state diagram to be implemented and the method of calculating the grace periods. In accordance with this embodiment of the invention, there can be up to three grace periods computed employing either time or a count of memory accesses or a combination of time and count. The number of bits selected for this sequence field depends upon the number of different state diagrams and grace period calculations to be supported. It is believed that 8 bits, supporting 256 such selections, would be adequate. Three state fields FB1, FB2 and FB3 set the first, second and third fallback states, respectively. In this example, each of the fields FB1, FB2 and FB3 includes two bits which indicate one of the four power states active, standby2, standby1, and sleep. Three period fields Period1, Period2 and Period3 specify the respective time periods for three fallback transitions. Likewise, three memory access counts Count1, Count2 and Count3 specify the respective memory access counts for three fallback transitions.

State control unit 530 is responsive to the state diagram and the outputs of comparators 514 and 514 to make the transitions specified by the sequence field. State control unit 530 controls the operation of multiplexer 511, period register 512, clock counter 513, comparator 514, multiplexer 521, count register 522, access counter 523 and comparator 524 to implement the specified grace period or periods. State control unit 530 controls multiplexer 511 to load one of the period counts Period1, Period2 or Period3 into period register 512. Clock counter 513 counts received clock pulses. Comparator 514 compares the period count stored in period register 511 and the clock count in clock counter 513. Comparator 514 signals state control unit 530 upon detection of a match. In a similar fashion, state control unit 530 controls multiplexer 521 to load one of the memory access counts Count1, Count2 or Count3 into count register 522. Access counter 523 counts the number of memory access requests. Comparator 524 compares the memory access count stored in count register 521 and the memory access request count in access counter 523. Comparator 524 signals state control unit 530 upon detection of a match. State control unit 530 provides control signals for selectively powering FLASH memory 145 in one of the four power states depending upon the sequence field, the FB1, FB2 and FB3 fields and the operation of comparators 514 and 524. The flexible circuitry of state machine 145 illustrated in FIG. 7 permits transition decisions to be made on many criteria. These could be time alone, count alone or some combination of time and count. Possible combinations of time and count include time followed by count, count followed by time, or exceeding the time or count transitions to differing states, such as illustrated in FIG. 6.

Those skilled in the art would realize that state machine 145 illustrated in FIG. 7 merely represents a design example of this invention. Many alternative embodiments are possible. FIG. 7 illustrates counting up clock pulses to measure time and comparing the count to a predetermined count. Likewise, FIG. 7 illustrates counting up memory accesses to measure their number and comparing the count to a predetermined count. Those skilled in the art would realize these intervals could just as easily be measured by preloading a counter with the predetermined count and counting down unit the count reaches zero. Other alternative circuits to measure time or number of memory accesses are possible, such as a state machine with many states which transition each clock pulse or memory access. State machine 145 illustrated in FIG. 7 represents an extreme in provision of control flexibility. If less control flexibility is desired, the circuits of FIG. 7 could be simplified. For example, if only a single fallback state is desired, then only a single period and/or a single memory access count need be stored. In addition, the state diagram would be fixed, thus the sequence field could be eliminated. With a single fallback state, the FB1, FB2 and FB3 fields are unnecessary. Additionally, the complexity of state control unit 530 could be greatly simplifier to support the single state diagram. The fields provided in power control parameter register 501 could be fixed upon manufacture or these fields could be loaded in software upon initialization of portable electronic device 100. Intermediate levels of flexibility could be supported by intermediate hardware complexity. On the other hand, state control unit 530 could keep a history of the timing of memory accesses and adaptively change the fields of power control register 501 based upon this history.

The present invention has been described in conjunction with a design example of a wireless telephone. Those skilled in the art would realize that this is merely a design example. This invention is applicable to any electronic apparatus having memory with at least two power states. This invention has been described in conjunction with FLASH memory. Those skilled in the art would realize that with proper adaption this invention is applicable to other types of nonvolatile memory such as read only memory (ROM) and electrically programmable read only memory (EPROM). This invention had been described in conjunction with nonvolatile memory. However, the essential feature is that the memory have more than one powered state and that it retains its data in all states. Thus with proper adaption this invention could be applicable to memory normally viewed as nonvolatile, such as static random access memory (SRAM) and dynamic random access memory (DRAM). It is also feasible to envision applications where retention of data at the lowest power levels is not important. Thus in some circumstances this invention could be applicable to static random access memory (SRAM) and dynamic random access memory (DRAM). The essential feature is balancing the respective capabilities of at least two power states.

What is claimed is:

1. A method of power consumption control of memory having a fully powered state and at least one lower power state, comprising the steps of:

when in said at least one lower power state changing to said fully powered state upon receipt of a memory access request;

responding to said memory access request in said fully powered state; and returning to said at least one lower power state after expiration of a grace period following a last memory access request.

2. The method of claim 1, wherein:

said grace period is measured by a predetermined time.

3. The method of claim 2, wherein:

said predetermined time is fixed in manufacture.

4. The method of claim 2, wherein:

said predetermined time is programmable in operation.

5. The method of claim 4, further comprising the step of:

storing an indication of said predetermined time in a control register.

6. The method of claim 4, further comprising the step of:

storing an indication of said predetermined time in a predetermined set of address locations within an address space of said memory.

7. The method of claim 2, further comprising the step of:

resetting said predetermined time upon receipt of a memory access request before expiration of said predetermined time.

8. The method of claim 1, wherein:

said grace period is measured by a predetermined number of memory access requests.

9. The method of claim 8, wherein:

said predetermined number of memory access requests is fixed in manufacture.

10. The method of claim 8, wherein:

said predetermined number of memory access requests is programmable in operation.

11. The method of claim 10, further comprising the step of:

storing an indication of said predetermined number of memory access requests in a control register.

12. The method of claim 10, further comprising the step of:

storing an indication of said predetermined number of memory access requests in a predetermined set of address locations within an address space of said memory.

13. The method of claim 1, wherein:

said grace period is measured by a combination of a predetermined time and a predetermined number of memory access requests.

14. The method of claim 13, wherein:

said step of returning to said at least one lower power state after expiration of said grace period includes returning to said at least one lower power state upon expiration of a first predetermined time after a last memory access request if less than a predetermined number of memory access requests have been received, and returning to said at least one lower power state upon expiration of second predetermined time shorter than said first predetermined time if said predetermined number of memory access requests have been received.

15. The method of claim 14, wherein:

said second predetermined time is receipt of a next clock cycle.

16. The method of claim 1, wherein:

said at least one lower power state consists of a plurality of lower power states; and said step of returning to said at least one lower power state after expiration of said grace period includes transitioning through plural lower power states.

17. An electronic device comprising:

a memory having a fully powered state and at least one lower power state;

a power control state machine connected to said memory and controlling whether said memory is in said fully powered state or said at least one lower power state, said power control state machine adapted for changing said memory from said at least one lower power state to said fully powered state upon receipt of a memory access request, and returning said memory to said at least one lower power state after expiration of a grace period following a last memory access request.

18. The electronic device of claim 17, wherein:

said state machine includes a timer for measuring said grace period as a predetermined time.

19. The electronic device of claim 18, wherein:

said predetermined time is fixed in manufacture.

20. The electronic device of claim 18, further comprising:

a control register storing an indication of said predetermined time; and said timer is connected to said control register and measures an interval of time defined by said indication of said predetermined time.

21. The electronic device of claim 18, further comprising:

said timer is connected to said memory and measures an interval of time defined by data stored at a predetermined set of address locations within an address space of said memory.

22. The electronic device of claim 18, wherein:

said state machine is further adapted to reset said timer upon receipt of a memory access request before expiration of said predetermined time.

23. The electronic device of claim 17, wherein:

said state machine includes a counter for measuring said grace period as a predetermined number of memory access requests.

24. The electronic device of claim 23, wherein:

said predetermined number of memory access requests is fixed in manufacture.

25. The electronic device of claim 23, further comprising:

a control register storing an indication of said predetermined number of memory access requests; and said counter is connected to said control register and measures said grace period defined by said indication of said predetermined number of memory access requests.

26. The electronic device of claim 23, further comprising:

said counter is connected to said memory and measures an said grace period defined by data stored at a predetermined set of address locations within an address space of said memory.

27. The electronic device of claim 17, wherein:

said state machine further includes
  a timer for measuring a predetermined time;
  a counter for measuring a predetermined number of memory access requests; and
  said state machine measures said grace period by a combination of said predetermined time and said predetermined number of memory access requests.

28. The electronic device of claim 17, further comprising:

an antenna;

a radio frequency transceiver;

a microphone;

a speaker;

a keypad;

a display;

a battery; and wherein said electronic device consists of a wireless telephone.

* * * * *

(12) EX PARTE REEXAMINATION CERTIFICATE (5377th)
United States Patent
Haroun et al.

(10) Number: US 6,151,262 C1
(45) Certificate Issued: May 23, 2006

(54) APPARATUS, SYSTEM AND METHOD FOR CONTROL OF SPEED OF OPERATION AND POWER CONSUMPTION OF A MEMORY

(75) Inventors: Baher S. Haroun, Allen, TX (US); Uming Ko, Plano, TX (US)

(73) Assignee: Texas Instruments Incorporated, Dallas, TX (US)

Reexamination Request:
No. 90/006,699, Jul. 7, 2003

Reexamination Certificate for:
Patent No.: 6,151,262
Issued: Nov. 21, 2000
Appl. No.: 09/426,960
Filed: Oct. 26, 1999

Related U.S. Application Data
(60) Provisional application No. 60/105,925, filed on Oct. 28, 1998.

(51) Int. Cl.
*G11C 7/00* (2006.01)

(52) U.S. Cl. .................... 365/227; 365/229; 713/300
(58) Field of Classification Search .............. None
See application file for complete search history.

(56) References Cited

U.S. PATENT DOCUMENTS

| | | | |
|---|---|---|---|
| 4,381,552 A | | 4/1983 | Nocilini et al. |
| 4,685,087 A | | 8/1987 | Shah |
| 4,718,043 A | | 1/1988 | Akatsuka |
| 4,918,658 A | | 4/1990 | Shah et al. |
| 4,933,785 A | | 6/1990 | Morehouse et al. |
| 4,972,312 A | * | 11/1990 | den Boef .............. 710/269 |
| 5,041,964 A | * | 8/1991 | Cole et al. ............ 713/322 |
| 5,144,585 A | | 9/1992 | Min et al. |
| 5,175,845 A | * | 12/1992 | Little .................... 713/323 |
| 5,203,000 A | * | 4/1993 | Folkes et al. ........ 713/340 |
| 5,262,998 A | * | 11/1993 | Mnich et al. ........ 365/222 |
| 5,404,334 A | | 4/1995 | Pascucci et al. |
| 5,430,683 A | | 7/1995 | Hardin et al. |
| 5,432,947 A | * | 7/1995 | Doi .................... 713/320 |
| 5,457,790 A | | 10/1995 | Iwamura et al. |
| 5,463,588 A | | 10/1995 | Chonan |
| 5,517,649 A | * | 5/1996 | McLean .............. 713/323 |
| 5,574,697 A | | 11/1996 | Manning |
| 5,623,453 A | | 4/1997 | Shinozaki |
| 5,646,902 A | | 7/1997 | Park |
| 5,719,812 A | | 2/1998 | Seki et al. |
| 5,726,946 A | | 3/1998 | Yamagata et al. |
| 5,737,746 A | | 4/1998 | Hardin et al. |
| 5,872,903 A | * | 2/1999 | Iwata et al. ........ 713/400 |
| 5,900,026 A | | 5/1999 | Ryu |
| 5,966,725 A | | 10/1999 | Tabo |
| 6,073,223 A | | 6/2000 | McAllister et al. |
| 6,563,746 B1 | * | 5/2003 | Fujioka et al. ...... 365/189.09 |
| 6,657,634 B1 | * | 12/2003 | Sinclair et al. ...... 345/534 |

OTHER PUBLICATIONS

Toshiba TMM2018AD Datasheet, Apr. 1987.
AMD Am29LV008 Datasheet, Aug. 1996.

* cited by examiner

Primary Examiner—Michael Tran

(57) ABSTRACT

This invention concerns power consumption control of memory having a fully powered state and at least one lower power state. The invention changes the memory to the fully powered state upon receipt of a memory access request. This memory access request is serviced in the fully powered state. The memory is returned to a lower power state after expiration of a grace period following a last memory access request. This grace period can be measured by a predetermined time or a predetermined number of memory access requests or a combination of these factors. The predetermined time may be fixed in manufacture or programmable in operation via a control register or data stored in a predetermined set of address locations within the address space of the memory. This invention is useful in portable electronic devices such as wireless telephones.

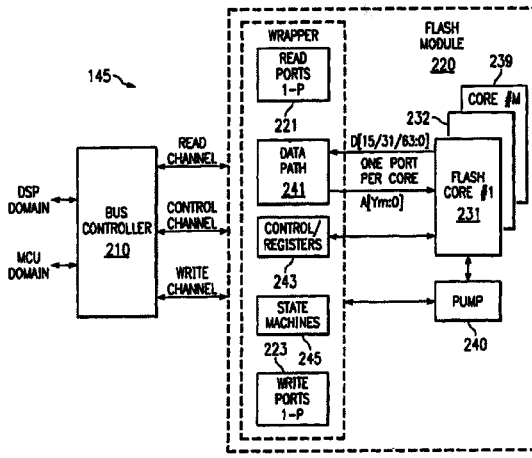

US 6,151,262 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 6, 12, 17, 21 and 26 are determined to be patentable as amended.

Claims 2–5, 7–11, 13–16, 18–20, 22–25 and 27–28, dependent on an amended claim, are determined to be patentable.

New claims 29–137 are added and determined to be patentable.

1. A method of power consumption control of *an integrated circuit* memory having a fully powered state and at least one lower power state, comprising the steps of:
   when in said at least one lower power state changing to said fully powered state upon receipt of a memory access request *including at least one control signal*;
   *storing the at least one control signal in said integrated circuit memory;*
   responding to said memory access request in said fully powered state; and
   returning to said at least one lower power state after expiration of a grace period following a last memory access request.

6. The method of claim 4, further comprising the step of:
   storing an indication of said predetermined time in a predetermined set of address locations within an address space of said *integrated circuit* memory.

12. The method of claim 10, further comprising the step of:
   storing an indication of said predetermined number of memory access requests in a predetermined set of address locations within an address space of said *integrated circuit* memory.

17. An electronic device comprising:
   [a] *an integrated circuit* memory having a fully powered state and at least one lower power state;
   a power control state machine connected to *and included with* said *integrated circuit* memory and controlling whether said *integrated circuit* memory is in said fully powered state or said at least one lower power state, said power control state machine adapted for changing said *integrated circuit* memory from said at least one lower power state to said fully powered state upon receipt of a memory access request, *said power control state machine storing said memory access request;* and
   returning said *integrated circuit* memory to said at least one lower power state after expiration of a grace period following a last memory access request.

21. The electronic device of claim 18, further comprising:
   said timer is connected to said *integrated circuit* memory and measures an interval of time defined by data stored at a predetermined set of address locations within an address space of said *integrated circuit* memory.

26. The electronic device of claim 23, further comprising:
   said counter is connected to said *integrated circuit* memory and measures an said grace period defined by data stored at a predetermined set of address locations within an address space of said *integrated circuit* memory.

29. *A method of power consumption control of an integrated circuit memory having a fully powered state and at least one lower power state, comprising the steps of:*
   *when in said at least one lower power state changing to said fully powered state upon receipt of a memory access request;*
   *responding to said memory access request in said fully powered state; and*
   *returning to said at least one lower power state after expiration of a grace period determined by a counter following a last memory access request, said counter being formed on said integrated circuit memory.*

30. *A method as in claim 29, wherein said counter counts a sequence of clock cycles.*

31. *A method as in claim 29, wherein said counter counts a sequence of memory accesses.*

32. *A method as in claim 29, wherein said counter is programmable.*

33. *A method as in claim 29, wherein said memory access request comprises at least one control signal.*

34. *A method as in claim 29, wherein said memory access request comprises an address transition.*

35. *A method as in claim 29, wherein said memory is a nonvolatile memory circuit.*

36. *A method of power consumption control of an integrated circuit memory having a fully powered state and at least one lower power state, comprising the steps of:*
   *when in said at least one lower power state changing to said fully powered state upon receipt of a memory access request;*
   *responding to said memory access request in said fully powered state; and*
   *returning to said at least one lower power state after expiration of a grace period determined by a programmable counter following a last memory access request, said programmable counter counting a sequence of clock cycles.*

37. *A method as in claim 36, wherein said programmable counter counts a sequence of memory accesses.*

38. *A method as in claim 36, wherein said memory access request comprises at least one control signal.*

39. *A method as in claim 36, wherein said memory access request comprises an address transition.*

40. *A method as in claim 36, wherein said at least one lower power state comprises plural lower power states.*

41. *A method as in claim 36, wherein said integrated circuit memory is a nonvolatile memory circuit.*

42. *A method as in claim 36, wherein said programmable counter is formed on said integrated circuit memory.*

43. *A method as in claim 36, wherein said integrated circuit memory is a memory of a wireless telephone, the wireless telephone comprising:*
   *an antenna;*
   *a baseband circuit coupled to said integrated circuit memory;*
   *a radio frequency transceiver coupled between the antenna and the baseband circuit;* a microphone coupled to the baseband circuit;

a speaker coupled to the baseband circuit; and a display coupled to the baseband circuit.

44. *A method of power consumption control of memory having a fully powered state and at least one lower power state, comprising the steps of:* when in said at least one lower power state changing to said fully powered state upon receipt of a memory access request comprising an address transition;

responding to said memory access request in said fully powered state; and returning to said at least one lower power state after expiration of a grace period determined by a counter following a last memory access request.

45. *A method as in claim 44, wherein said counter counts a sequence of clock cycles.*

46. *A method as in claim 44, wherein said counter counts a sequence of memory accesses.*

47. *A method as in claim 44, wherein said counter is programmable.*

48. *A method as in claim 44, wherein said memory access request comprises at least one control signal.*

49. *A method as in claim 44, wherein said at least one lower power state comprises plural lower power states.*

50. *A method as in claim 44, wherein said memory is a nonvolatile memory circuit.*

51. *A method as in claim 44, wherein said memory and said counter are formed on an integrated circuit.*

52. *A method as in claim 44, wherein said memory is a memory of a wireless telephone, the wireless telephone comprising:* an antenna;

a baseband circuit coupled to said memory;

a radio frequency transceiver coupled between the antenna and the baseband circuit;

a microphone coupled to the baseband circuit;

a speaker coupled to the baseband circuit; and a display coupled to the baseband circuit.

53. *A method of power consumption control of memory having a fully powered state and a plurality of lower power states, comprising the steps of:* when in at least one of said lower power states changing to said fully powered state upon receipt of a memory access request;

responding to said memory access request in said fully powered state; and returning to at least one of said lower power states after expiration of a grace period determined by a counter following a last memory access request, said counter counting a sequence of memory accesses.

54. *A method as in claim 53, wherein said counter counts a sequence of clock cycles.*

55. *A method as in claim 53, wherein said counter is programmable.*

56. *A method as in claim 53, wherein said memory access comprises at least one control signal.*

57. *A method as in claim 53, wherein said memory access comprises an address transition.*

58. *A method as in claim 53, wherein said memory is a nonvolatile memory circuit.*

59. *A method as in claim 53, wherein said memory and said counter are formed on an integrated circuit.*

60. *A method as in claim 53, wherein said memory is a memory of a wireless telephone, the wireless telephone comprising:* an antenna;

a baseband circuit coupled to said memory;

a radio frequency transceiver coupled between the antenna and the baseband circuit;

a microphone coupled to the baseband circuit;

a speaker coupled to the baseband circuit; and a display coupled to the baseband circuit.

61. *A method of power consumption control of a nonvolatile memory circuit having a fully powered state and at least one lower power state, comprising the steps of:* when in said at least one lower power state changing to said fully powered state upon receipt of a memory access request;

responding to said memory access request in said fully powered state; and returning to said at least one of said lower power state after expiration of a grace period determined by a counter following a last memory access request, said counter counting a sequence of memory accesses.

62. *A method as in claim 61, wherein said counter counts a sequence of clock cycles.*

63. *A method as in claim 61, wherein said nonvolatile memory circuit and said counter are formed on an integrated circuit.*

64. *A method as in claim 61, wherein said counter is programmable.*

65. *A method as in claim 61, wherein said memory access comprises at least one control signal.*

66. *A method as in claim 61, wherein said memory access comprises an address transition.*

67. *A method as in claim 61, wherein said nonvolatile memory circuit determines said grace period.*

68. *A method as in claim 61, wherein said nonvolatile memory circuit is a memory of a wireless telephone, the wireless telephone comprising:* an antenna;

a baseband circuit coupled to said nonvolatile memory circuit;

a radio frequency transceiver coupled between the antenna and the baseband circuit;

a microphone coupled to the baseband circuit;

a speaker coupled to the baseband circuit; and a display coupled to the baseband circuit.

69. *A method of power consumption control of memory having a fully powered state and at least one lower power state, comprising the steps of:* when in said at least one lower power state changing to said fully powered state upon receipt of a memory access request comprising an address transition;

responding to said memory access request in said fully powered state; and returning to said at least one lower power state after expiration of a programmable grace period following a last memory access request.

70. *A method as in claim 69, wherein said programmable grace period comprises counting a programmable number of clock cycles.*

71. *A method as in claim 69, wherein said programmable grace period comprises counting a programmable number of memory accesses.*

72. *A method as in claim 69, wherein said memory access request comprises at least one control signal.*

73. *A method as in claim 69, wherein said at least one lower power state comprises plural lower power states.*

74. A method as in claim 69, wherein said memory is a nonvolatile memory circuit.

75. A method as in claim 69, wherein said programmable grace period is determined by a counter, and wherein said counter and said memory are formed on an integrated circuit.

76. A method as in claim 69, wherein said memory is a memory of a wireless telephone, the wireless telephone comprising:
   an antenna;
   a baseband circuit coupled to said memory;
   a radio frequency transceiver coupled between the antenna and the baseband circuit;
   a microphone coupled to the baseband circuit;
   a speaker coupled to the baseband circuit; and
   a display coupled to the baseband circuit.

77. A method of power consumption control of memory having a fully powered state and a plurality of lower power states, comprising the steps of:
   when in at least one of said lower power states changing to said fully powered state upon receipt of a memory access request;
   responding to said memory access request in said fully powered state; and
   returning to at least one of said lower power states after expiration of a programmable grace period following a last memory access request, wherein said programmable grace period comprises counting a programmable number of clock cycles.

78. A method as in claim 77, wherein said memory comprises a portable electronic device.

79. A method as in claim 77, wherein said programmable grace period comprises counting a programmable number of memory accesses.

80. A method as in claim 77, wherein said memory access request comprises at least one control signal.

81. A method as in claim 77, wherein said memory is a nonvolatile memory circuit.

82. A method as in claim 77, wherein said programmable grace period is determined by a counter, and wherein said counter and said memory are formed on an integrated circuit.

83. A method as in claim 77, wherein said memory is a memory of a wireless telephone, the wireless telephone comprising:
   an antenna;
   a baseband circuit coupled to said memory;
   a radio frequency transceiver coupled between the antenna and the baseband circuit;
   a microphone coupled to the baseband circuit;
   a speaker coupled to the baseband circuit; and
   a display coupled to the baseband circuit.

84. A method of power consumption control of a nonvolatile memory circuit having a fully powered state and at least one lower power state, comprising the steps of:
   when in said at least one lower power state changing to said fully powered state upon receipt of a memory access request;
   responding to said memory access request in said fully powered state; and
   returning to said at least one lower power state after expiration of a programmable grace period following a last memory access request, wherein said programmable grace period comprises counting a programmable number of clock cycles.

85. A method as in claim 84, wherein said memory comprises a portable electronic device.

86. A method as in claim 84, wherein said programmable grace period comprises counting a programmable number of memory accesses.

87. A method as in claim 84, wherein said programmable grace period is determined by a counter, and wherein said counter and said nonvolatile memory circuit are formed on an integrated circuit.

88. A method as in claim 84, wherein said nonvolatile memory circuit is a memory of a wireless telephone, the wireless telephone comprising:
   an antenna;
   a baseband circuit coupled to said nonvolatile memory circuit;
   a radio frequency transceiver coupled between the antenna and the baseband circuit;
   a microphone coupled to the baseband circuit;
   a speaker coupled to the baseband circuit; and
   a display coupled to the baseband circuit.

89. A method of power consumption control of memory having a fully powered state and at least one lower power state, comprising the steps of:
   when in said at least one lower power state changing to said fully powered state upon receipt of a memory access request;
   responding to said memory access request in said fully powered state; and
   returning to said at least one lower power state after expiration of a programmable grace period determined by said memory following a last memory access request.

90. A method as in claim 89, wherein said programmable grace period comprises counting a programmable number of clock cycles.

91. A method as in claim 89, wherein said programmable grace period comprises counting a programmable number of memory accesses.

92. A method as in claim 89, wherein said memory is a memory of a wireless telephone, the wireless telephone comprising:
   an antenna;
   a baseband circuit coupled to said memory;
   a radio frequency transceiver coupled between the antenna and the baseband circuit;
   a microphone coupled to the baseband circuit;
   a speaker coupled to the baseband circuit; and
   a display coupled to the baseband circuit.

93. A method of power consumption control of memory having a fully powered state and a plurality of lower power states, comprising the steps of:
   when in at least one of said lower power states changing to said fully powered state upon receipt of a memory access request;
   responding to said memory access request in said fully powered state; and
   returning to at least one of said lower power states after expiration of a grace period determined by said memory following a last memory access request.

94. A method as in claim 93, wherein said memory determines said grace period by counting a number of clock cycles.

95. A method as in claim 93, wherein said memory determines said grace period by counting a number of memory accesses.

96. A method as in claim 93, wherein said grace period is determined by a counter formed on an integrated circuit with said memory.

97. A method as in claim 93, wherein said grace period is determined by a programmable counter.

98. A method as in claim 93, wherein said memory access request comprises at least one control signal.

99. A method as in claim 93, wherein said memory access request comprises an address transition.

100. A method as in claim 93, wherein said at least one lower power state comprises plural lower power states.

101. A method as in claim 93, wherein said memory is a nonvolatile memory circuit.

102. A method as in claim 93, wherein said memory is a memory of a wireless telephone, the wireless telephone comprising:
an antenna;
a baseband circuit coupled to said memory;
a radio frequency transceiver coupled between the antenna and the baseband circuit;
a microphone coupled to the baseband circuit;
a speaker coupled to the baseband circuit; and
a display coupled to the baseband circuit.

103. A wireless telephone comprising:
an antenna;
a radio frequency transceiver coupled to the antenna;
a baseband circuit coupled to the radio frequency transceiver;
a microphone coupled to the baseband circuit;
a speaker coupled to the baseband circuit;
a display coupled to the baseband circuit;
wherein the baseband circuit comprises a memory having a fully powered state and at least one lower power state; and
a power control state machine connected to said memory and controlling whether said memory is in said fully powered state or said at least one lower power state, said power control state machine adapted for changing said memory from said at least one lower power state to said fully powered state upon receipt of a memory access request, and returning said memory to said at least one lower power state after expiration of a grace period following a last memory access request.

104. A wireless telephone as in claim 103, wherein said grace period is determined by counting a number of clock cycles.

105. A wireless telephone as in claim 103, wherein said grace period is determined by counting a number of memory accesses.

106. A wireless telephone as in claim 103, wherein said grace period is determined by a counter formed on said baseband circuit.

107. A wireless telephone as in claim 103, wherein said counter is programmable.

108. A wireless telephone as in claim 103, wherein said memory access request comprises at least one control signal.

109. A wireless telephone as in claim 103, wherein said memory access request comprises an address transition.

110. A wireless telephone as in claim 103, wherein said at least one lower power state comprises plural lower power states.

111. A wireless telephone as in claim 103, wherein said memory is a nonvolatile memory circuit.

112. A method of power consumption control of memory having a fully powered state and a plurality of lower power states, comprising the steps of:
when in at least one of said lower power states changing to said fully powered state upon receipt of a memory access request including at least one control signal;
storing the at least one control signal in said memory;
responding to said memory access request in said fully powered state; and
returning to at least one of said lower power states after expiration of a grace period determined by a counter following a last memory access request.

113. A method as in claim 112, wherein said memory determines said grace period by counting a number of clock cycles.

114. A method as in claim 112, wherein said memory determines said grace period by counting a number of memory accesses.

115. A method as in claim 112, wherein said counter is formed on an integrated circuit with said memory.

116. A method as in claim 112, wherein said memory is a nonvolatile memory circuit.

117. A method as in claim 112, wherein said memory is a memory of a wireless telephone, the wireless telephone comprising:
an antenna;
a baseband circuit coupled to said memory;
a radio frequency transceiver coupled between the antenna and the baseband circuit;
a microphone coupled to the baseband circuit;
a speaker coupled to the baseband circuit; and
a display coupled to the baseband circuit.

118. A method of power consumption control of an integrated circuit memory having a fully powered state and a plurality of lower power states, comprising the steps of:
when in at least one of said lower power states changing to said fully powered state upon receipt of a memory access request;
responding to said memory access request in said fully powered state; and
returning to said at least one of said lower power states after expiration of a grace period determined by a counter following a last memory access request, said counter being formed on said integrated circuit memory.

119. A method as in claim 118, wherein said integrated circuit memory determines said grace period by counting a number of clock cycles.

120. A method as in claim 118, wherein said integrated circuit memory determines said grace period by counting a number of memory accesses.

121. A method as in claim 118, wherein said counter is formed on an integrated circuit with said integrated circuit memory.

122. A method as in claim 118, wherein said integrated circuit memory is a nonvolatile memory circuit.

123. A method as in claim 118, wherein said integrated circuit memory is a memory of a wireless telephone, the wireless telephone comprising:
an antenna;
a baseband circuit coupled to said integrated circuit memory;
a radio frequency transceiver coupled between the antenna and the baseband circuit;
a microphone coupled to the baseband circuit;
a speaker coupled to the baseband circuit; and
a display coupled to the baseband circuit.

124. A method of power consumption control of an integrated circuit memory of a wireless telephone having a fully powered state and at least one lower power state, comprising the steps of:
- when in said at least one lower power state changing to said fully powered state upon receipt of a memory access request;
- responding to said memory access request in said fully powered state; and
- returning to said at least one lower power state after expiration of a grace period determined by a counter following a last memory access request, said counter being formed on said integrated circuit memory, wherein said wireless telephone comprises:
- an antenna;
- a baseband circuit coupled to said integrated circuit memory;
- a radio frequency transceiver coupled between the antenna and the baseband circuit;
- a microphone coupled to the baseband circuit;
- a speaker coupled to the baseband circuit; and
- a display coupled to the baseband circuit.

125. A method as in claim 124, wherein said integrated circuit memory determines said grace period by counting a number of clock cycles.

126. A method as in claim 124, wherein said integrated circuit memory determines said grace period by counting a number of memory accesses.

127. A method as in claim 124, wherein said counter is formed on an integrated circuit with said integrated circuit memory.

128. A method as in claim 124, wherein said integrated circuit memory is a nonvolatile memory circuit.

129. A method of power consumption control of memory of a wireless telephone having a fully powered state and at least one lower power state, comprising the steps of:
- when in said at least one lower power state changing to said fully powered state upon receipt of a memory access request;
- responding to said memory access request in said fully powered state; and
- returning to said at least one lower power state after expiration of a grace period following a last memory access request, wherein said wireless telephone comprises:
- an antenna;
- a baseband circuit coupled to said memory;
- a radio frequency transceiver coupled between the antenna and the baseband circuit;
- a microphone coupled to the baseband circuit;
- a speaker coupled to the baseband circuit; and
- a display coupled to the baseband circuit.

130. A method as in claim 129, wherein said memory access request comprises a signal, and wherein said memory stores said signal.

131. A method as in claim 129, wherein said memory determines said grace period by counting a number of clock cycles.

132. A method as in claim 129, wherein said memory determines said grace period by counting a number of memory accesses.

133. A method as in claim 129, wherein said grace period is determined by a counter formed on an integrated circuit with said memory.

134. A method as in claim 129, wherein said memory access request comprises at least one control signal.

135. A method as in claim 129, wherein said memory access request comprises an address transition.

136. A method as in claim 129, wherein said at least one lower power state comprises plural lower power states.

137. A method as in claim 129, wherein said memory is a nonvolatile memory circuit.

* * * * *